United States Patent
Al-Eidan (10) Patent No.: US 6,205,184 B1
(45) Date of Patent: *Mar. 20, 2001

(54) SYSTEM AND METHOD FOR COMPRESSING A TRANSMITTED SIGNAL TO ACHIEVE NARROW AND VERY NARROW BAND FREQUENCY OR PHASE MODULATION

(76) Inventor: Abdullah A. Al-Eidan, Area #3, 22 Avenue, 4th Street House No. 13, Bayan 43600 (KW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/580,736

(22) Filed: Dec. 29, 1995

(30) Foreign Application Priority Data

Dec. 30, 1994 (EP) .................................. 94120923

(51) Int. Cl.⁷ ............................. H04B 1/16; H04B 14/00; H03D 3/00

(52) U.S. Cl. ............................. 375/316; 375/271; 455/42; 455/44; 455/205

(58) Field of Search .................................. 375/220, 270, 375/277, 301, 316, 321, 371, 320, 322; 455/47, 42, 131, 44; 381/7

(56) References Cited

U.S. PATENT DOCUMENTS

| | | | |
|---|---|---|---|
| 2,230,231 | * 2/1941 | Crosby | 455/42 |
| 3,866,122 | * 2/1975 | Baer et al. | 455/44 |
| 4,103,239 | * 7/1978 | Maewezen | 455/116 |
| 4,117,405 | * 9/1978 | Martinez | 455/54.1 |
| 4,208,630 | * 6/1980 | Martinez | 375/219 |
| 4,551,756 | * 11/1985 | Ogawa et al. | 348/738 |
| 4,581,749 | * 4/1986 | Carney et al. | 375/303 |
| 4,906,942 | * 3/1990 | Nakai et al. | 329/318 |
| 4,919,137 | * 4/1990 | Schaldach | 607/19 |
| 4,928,177 | * 5/1990 | Martinez | 348/12 |
| 5,337,024 | * 8/1994 | Collins | 332/127 |

FOREIGN PATENT DOCUMENTS

| | | |
|---|---|---|
| 0 545 596 | 6/1993 | (EP) . |
| 2 015 282 | 9/1979 | (GB) . |
| WO 90/16 115 | 12/1990 | (WO) . |

OTHER PUBLICATIONS

"SL6601C Low Poer IF/AF PLL Circuit for Narrow Band FM, " *Linear Integrated Circuit Handbook*, Plessey Semiconductors, Sep. 1985, pp. 121–123.

* cited by examiner

Primary Examiner—Young T. Tse
(74) Attorney, Agent, or Firm—Jacobson, Price, Holman & Stern, PLLC (57) ABSTRACT

The present system increases the number of channels in a given communication band by using narrow or very narrow band frequency modulation (FM) or phase modulation (PM). The system also improves sound quality, increases the signal-to-noise ratio, increases the power of the transmitted information, and/or achieves high selectivity, high fidelity and/or low distortion. Narrow band FM or PM signal communication can be implemented by transmitting a signal with a narrow or very narrow frequency spectrum, receiving the signal, converting the received signal to an IF (intermediate frequency) signal, and then expanding the narrow frequency deviation of the FM or PM signal. The narrow band frequency deviation may be expanded by frequency-multiplying the IF signal. A discriminator may then convert the frequency-deviation-multiplied signal to a low frequency signal or audio signal for further processing.

14 Claims, 13 Drawing Sheets

SYSTEM AND METHOD FOR COMPRESSING A TRANSMITTED SIGNAL TO ACHIEVE NARROW AND VERY NARROW BAND FREQUENCY OR PHASE MODULATION

BACKGROUND OF THE INVENTION

1. Field of the Invention

The present invention relates to communication systems using narrow or very narrow band channels, so that the number of channels available for different types of communication systems (for example, cellular telephones, pagers, police/fire/rescue) can be increased. Specifically, the invention relates to a system and method for transmitting and receiving PM- or FM-based signals on narrow or very narrow band channels.

2. Related Art

In recent years, the VHF and UHF bands that were reserved to be allocated for use in communications have become highly congested, especially with the expanding use of cellular telephone and pager networks. However, due to restrictions imposed by current technology, government regulation and international agreement, the total available bandwidths in the VHF and UHF ranges, and consequently, the number of channels available in those band widths, are limited. With an expanding demand for communication systems which use those frequency bands, there is a growing need for a larger number of channels to be made available for allocation.

This need for more channels has led many manufacturers in the field to use higher frequency bands to avoid interference between channels and to achieve better frequency management. However, it is believed that using the higher UHF bands will expose users and operators to high frequency radiation that may cause health problems.

Another solution to the need for more channels which avoids the potential health risks involved in using the higher UHF bands is to increase the number of channels within the currently used frequency bands using a system with narrow channel bandwidths. However, such systems as currently designed produce poor sound quality and low data transmission rates.

Thus, there is a need in the art to provide transmission systems in which the information is transmitted in a narrow or very narrow bandwidth channel to provide a greater number of channels, but which still provides good sound quality at the receiving end.

SUMMARY OF THE INVENTION

The present invention is directed to providing a solution to the growing need for more channels, while overcoming the problems inherent in the current designs and implementations of narrow band systems.

The present invention provides a system for increasing the number of channels by using narrow band frequency modulation (FM) or Phase Modulation (PM), so that excellent sound quality levels and high data rates can be achieved. In particular, a purpose of the invention is to use narrow/very narrow band frequency or phase modulation transmitters and receivers to increase the number of channels, improve sound quality, increase the signal-to-noise ratio, increase the power of the transmitted information, and/or achieve high selectivity, high fidelity and/or low distortion.

In the present invention, a narrow band FM or PM signal transmission can be implemented by transmitting a signal in a narrow or very narrow frequency band, receiving the signal, converting the received signal to an IF (intermediate frequency) signal, and then expanding the narrow frequency deviation of the FM or PM signal. The narrow band frequency deviation is expanded by frequency-multiplying the IF signal. The frequency-multiplied signal may be converted to a low frequency signal or audio signal by a discriminator for further processing.

BRIEF DESCRIPTION OF THE DRAWINGS

The invention is better understood by reading the following Detailed Description of the Preferred Embodiments with reference to the accompanying drawing figures, in which like reference numerals refer to like or similar elements throughout, and in which.

DETAILED DESCRIPTION OF THE PREFERRED EMBODIMENTS

In describing preferred embodiments of the present invention illustrated in the drawings, specific terminology is employed for the sake of clarity. However, the invention is not intended to be limited to the specific terminology so selected, and it is to be understood that each specific element includes all technical equivalents which operate in a similar manner to accomplish a similar purpose. A frequency modulation (FM) system is described in detail by way of example, although it is understood that a corresponding phase modulator components can be substituted for frequency modulator components to form a phase modulation (PM) system. Moreover, minor functional elements (such as power supplies and the like) well understood by those skilled in the art may be purposely omitted from the following discussion.

In FM/PM, there are two stages of frequency deviation. The first stage, where primary frequency deviation is performed, occurs in the frequency/phase modulator. In the modulator, the carrier frequency fluctuates or deviates at a rate according to the amplitude or to the amplitude and frequency of the modulating signal. The second stage, where secondary frequency deviation is performed, occurs in the frequency multiplier stage.

The result of the two stages of frequency deviation offers a means for obtaining practically any desired amount or value for the carrier frequency, frequency deviation and modulation index. In an FM/PM receiver, the value of the modulation index M determines the quality of the sound. If the modulation index is high, thereby corresponding to a high level of frequency deviation (wide band), the frequency discriminator becomes more sensitive, can detect minor modulating signals, and has a better signal to noise ratio.

The invention provides FM/PM transmitters and receivers in which frequency or phase modulating of the signal to be transmitted is performed at the transmitting side of a communication channel with a preselected small or very small frequency deviation (modulation index $M \leq 1.0$). After the frequency or phase modulated signal is transmitted via the communication channel and received at the receiving side of the communication channel, a narrow band intermediate frequency (IF) signal is applied, and the frequency deviation of the received signal is expanded. This frequency deviation expansion at the receiving side of the communication channel is preferably realized by frequency multiplication. Consequently, the expanded frequency or phase modulated signal can be further processed in any desired manner.

The invention is described with reference to exemplary non-limiting embodiments shown in the accompanying drawings.

Figure 1:
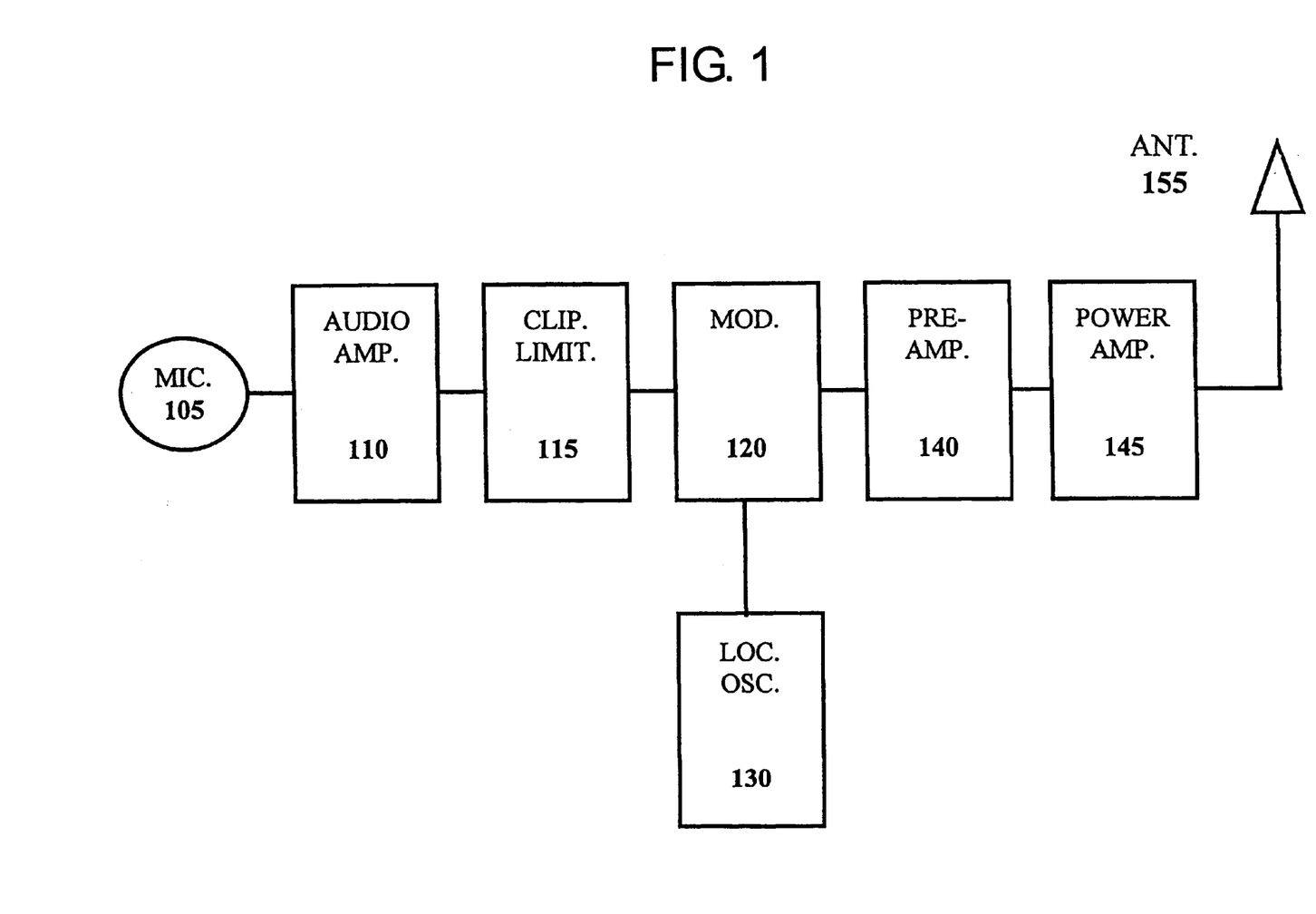
FIG. 1 shows a block diagram of an embodiment of a narrow/very narrow band transmitter for FM or PM signals constructed in accordance with the present invention.

FIG. 1 is a block diagram of a preferred frequency or phase modulation transmitter. After its input 105 (which may be a microphone), the transmitter includes an audio frequency amplifier 110 succeeded by a clipper limiter 115, in turn succeeded by a modulator stage 120 (such as a frequency modulator) with a local oscillator 130. Connected in series with the output of the frequency modulator stage 120 is a preamplifier 140 and a power amplifier 145 which drives a suitable antenna 155 (or other communication channel interface).

Significantly, the modulation index M is selected to be a small value (preferably less than or equal to 1.0), resulting in a small/very small frequency band for transmitting the output signal of the transmitter.

Figure 2:
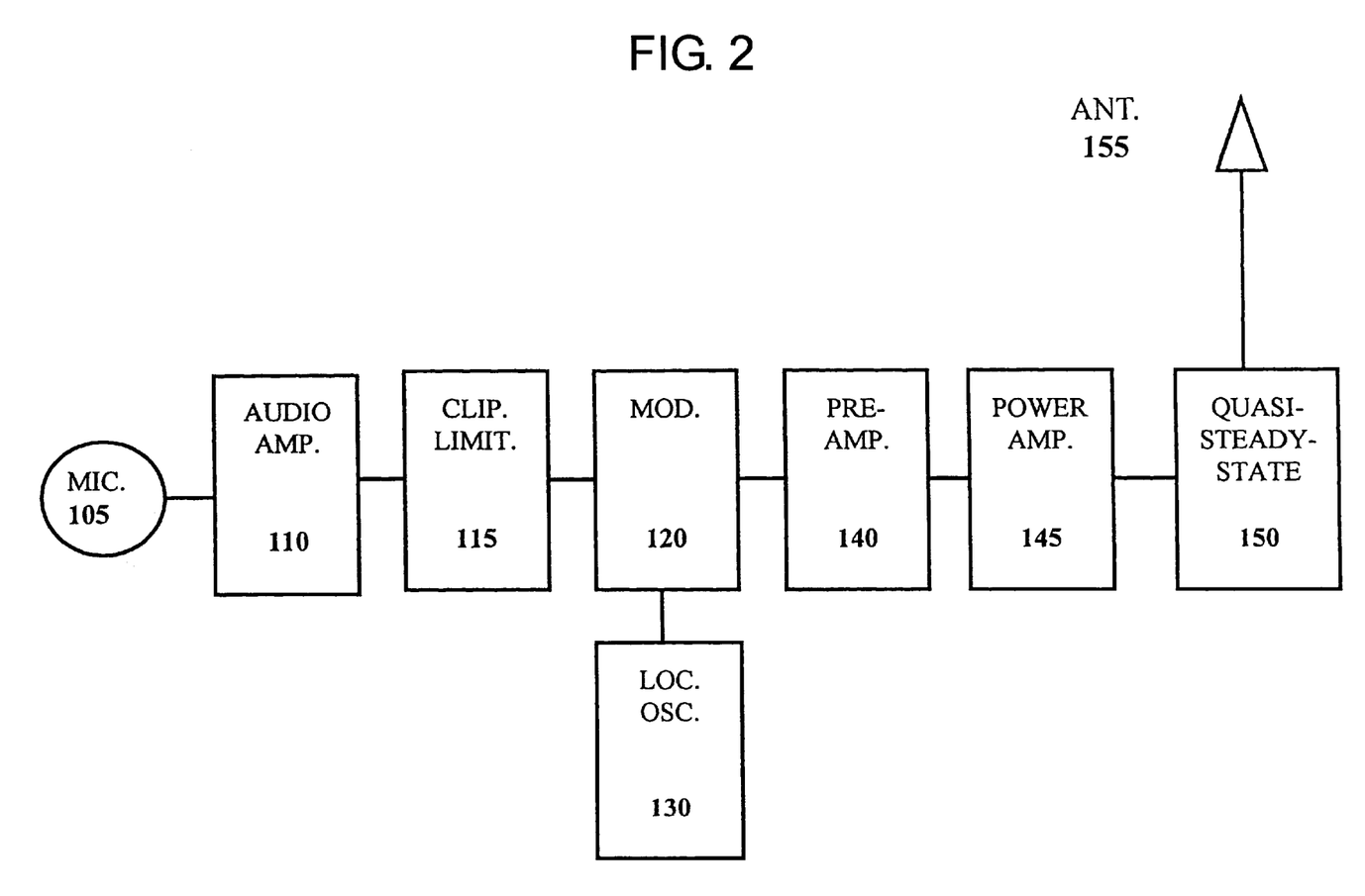
FIG. 2 shows a block diagram of an alternative embodiment of a narrow/very narrow band transmitter for FM or PM signals constructed in accordance with the present invention.

FIG. 2 shows a block diagram of an alternative embodiment of the FM/PM modulation transmitter, although a frequency modulation transmitter is described by way of example. Many elements in this embodiment correspond to those in the transmitter according to FIG. 1, and will not be repetitively described. However, to remove distortion in shape in the FM modulated signal, particularly if the modulation index is low, a quasi-steady-state circuit 150 is inserted after the power amplifier 145. The quasi-steady-state circuit can be implemented as a resonant load impedance of the power amplifier. Because of the addition of the quasi-steady-state circuit 150, the FM or PM modulated signal can be provided with less distortion.

Figure 3:
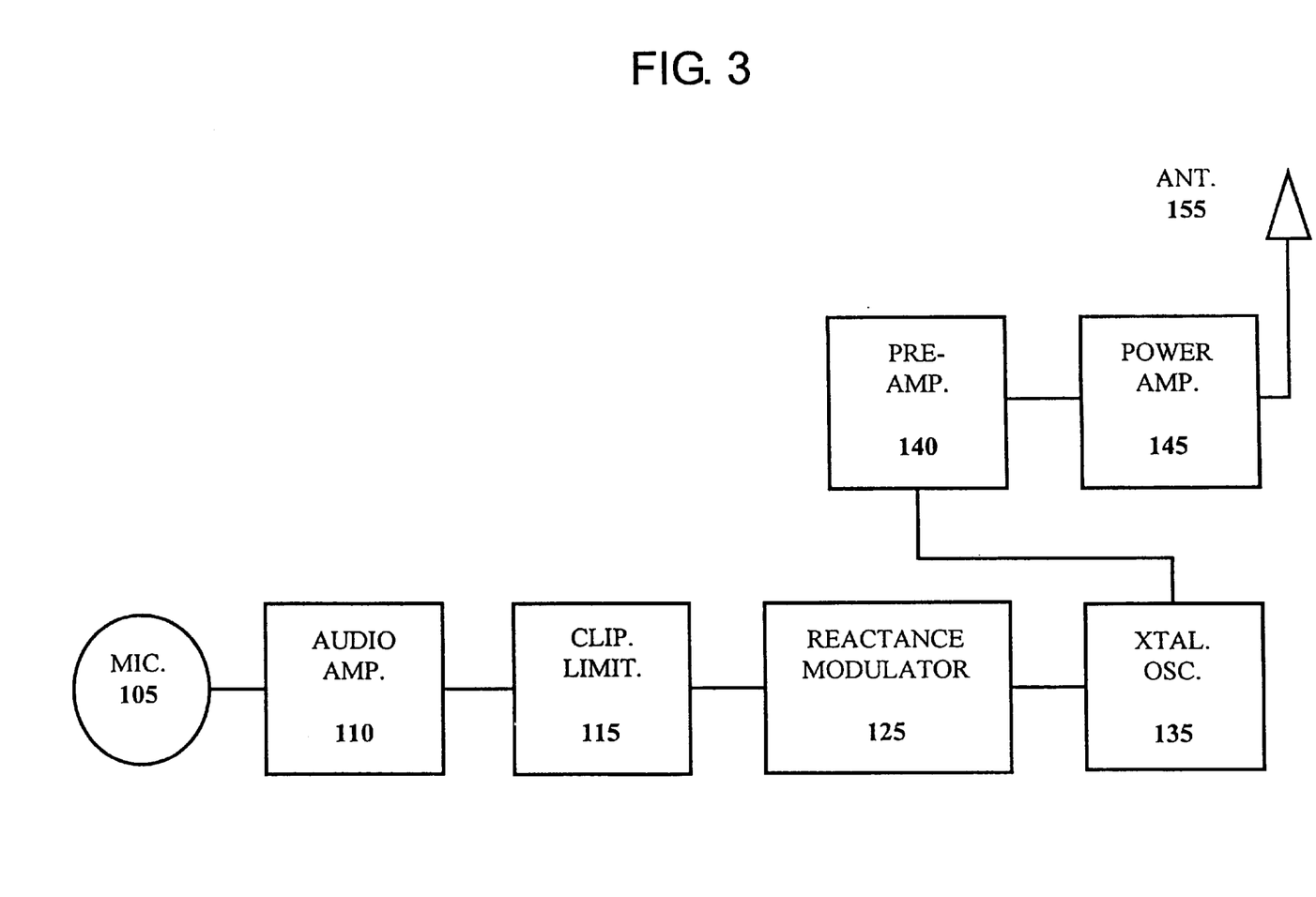
FIG. 3 shows a block diagram of a further alternative embodiment of a narrow/very narrow band transmitter for FM or PM signals constructed in accordance with the present invention.

FIG. 3 shows a block diagram of an alternative embodiment of the modulator-transmitter for transmitting a narrow/very narrow band FM/PM modulation signal. Many elements of this embodiment correspond to those of the transmitter of FIG. 1, and will not be described repetitively. However, instead of modulator 120 and local oscillator 130 as in FIG. 1, the FIG. 3 embodiment includes a reactance modulator 125 and crystal oscillator 135 arranged in series between clipper limiter 115 and preamplifier 140.

Figure 4:
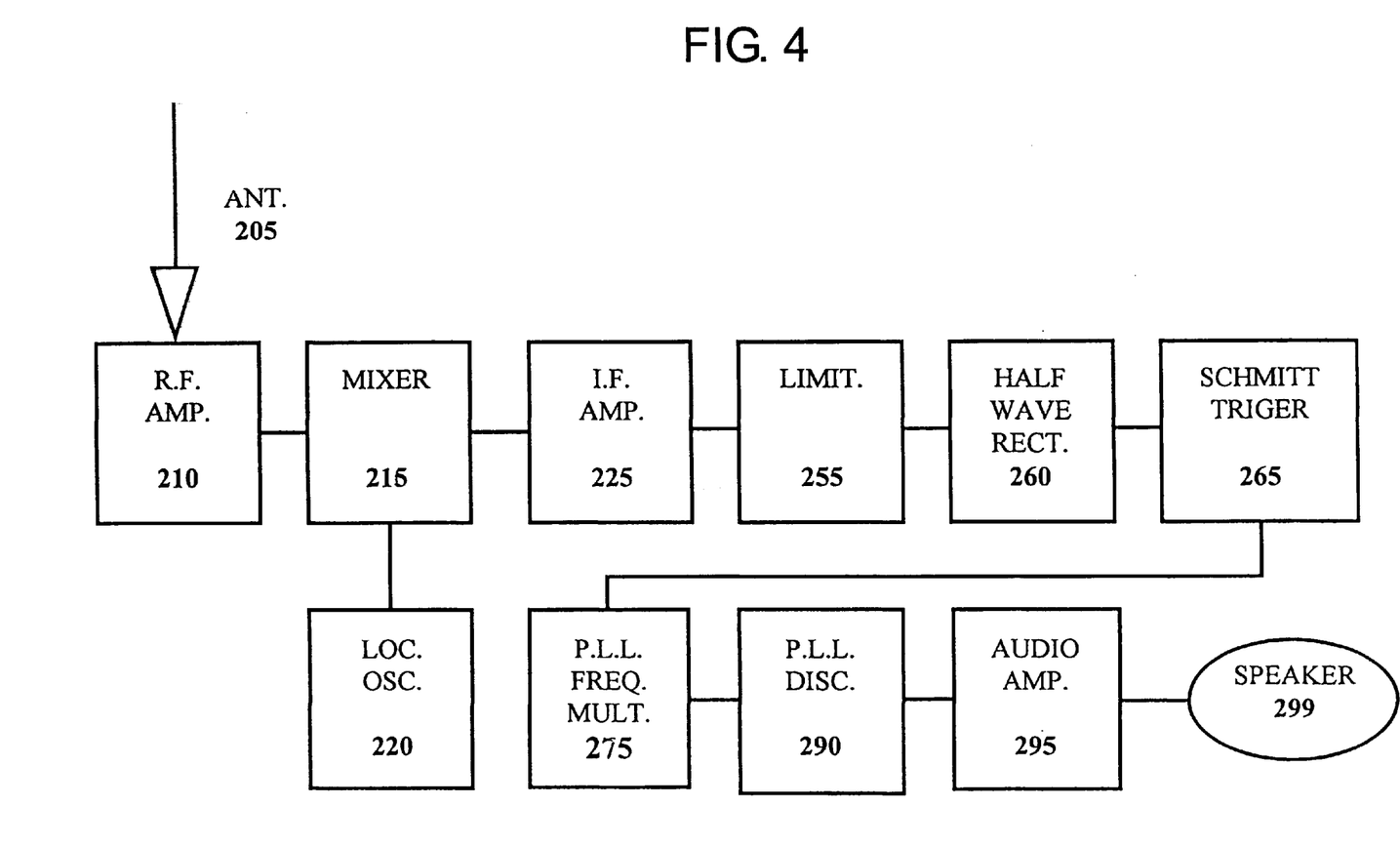
FIG. 4 shows a block diagram of an embodiment of a narrow/very narrow band receiver for FM signals constructed in accordance with the present invention.

FIG. 4 shows an embodiment of a receiver for receiving the narrow band FM signal transmitted from the transmitter according to FIGS. 1–3. The receiver includes a suitable antenna 205 (or other communication channel interface), an RF amplifier 210, a mixer 215 with a local oscillator 220 for down converting the received FM or PM signal into an IF-signal. The mixer 215 is succeeded by an IF amplifier 225 which is followed by a limiter 255 to eliminate all amplitude variation from the signal. Also, the DC component is removed from the signal. The limiter 255 is connected to a half wave rectifier 260 to cut the negative half of the IF sine wave signal. The half wave rectifier 260 is succeeded by a schmitt trigger 265 to shape the positive half of the IF signal into positive pulses.

In accordance with a preferred embodiment of the invention, the receiver includes a frequency multiplier stage 275 (preferably a PLL—phase lock loop) to multiply the IF positive pulses to generate an expanded frequency deviation which compensates for the narrow band frequency deviation which was transmitted.

The frequency multiplier stage 275 is followed by a PLL discriminator 290 which converts the output of the limiter back to an audio signal which may be applied to an audio amplifier 295 and to a piece of conventional audio equipment including a speaker 299.

It is an advantage of the invention that, when the frequency expanded signal is applied to discriminator 290, the discriminator shows improved discrimination properties with less distortion as compared with the processing of a non-expanded signal. Accordingly, the combination of a narrow or very narrow band modulator transmitter (FIGS. 1–3) with a frequency multiplier (e.g., element 275) provides a significant advantage over known systems.

The frequency multiplication in element 275 may be implemented using, for example, a suitable non-linear circuit element and filtering out the non-wanted frequency ranges. For example, a conventional limiter circuit may be used which generates a pulse signal from a sine signal. Because the pulse signal includes all odd harmonics of the input sine function, a higher frequency component thereof, for example the ninth harmonic, may be filtered out, thus realizing a multiplication of the frequency by a multiplication factor 9.

To realize even higher multiplication factors, a plurality of these multipliers may be connected in series. To compensate any resulting loss in amplitude, additional amplification could be employed.

Figure 5:
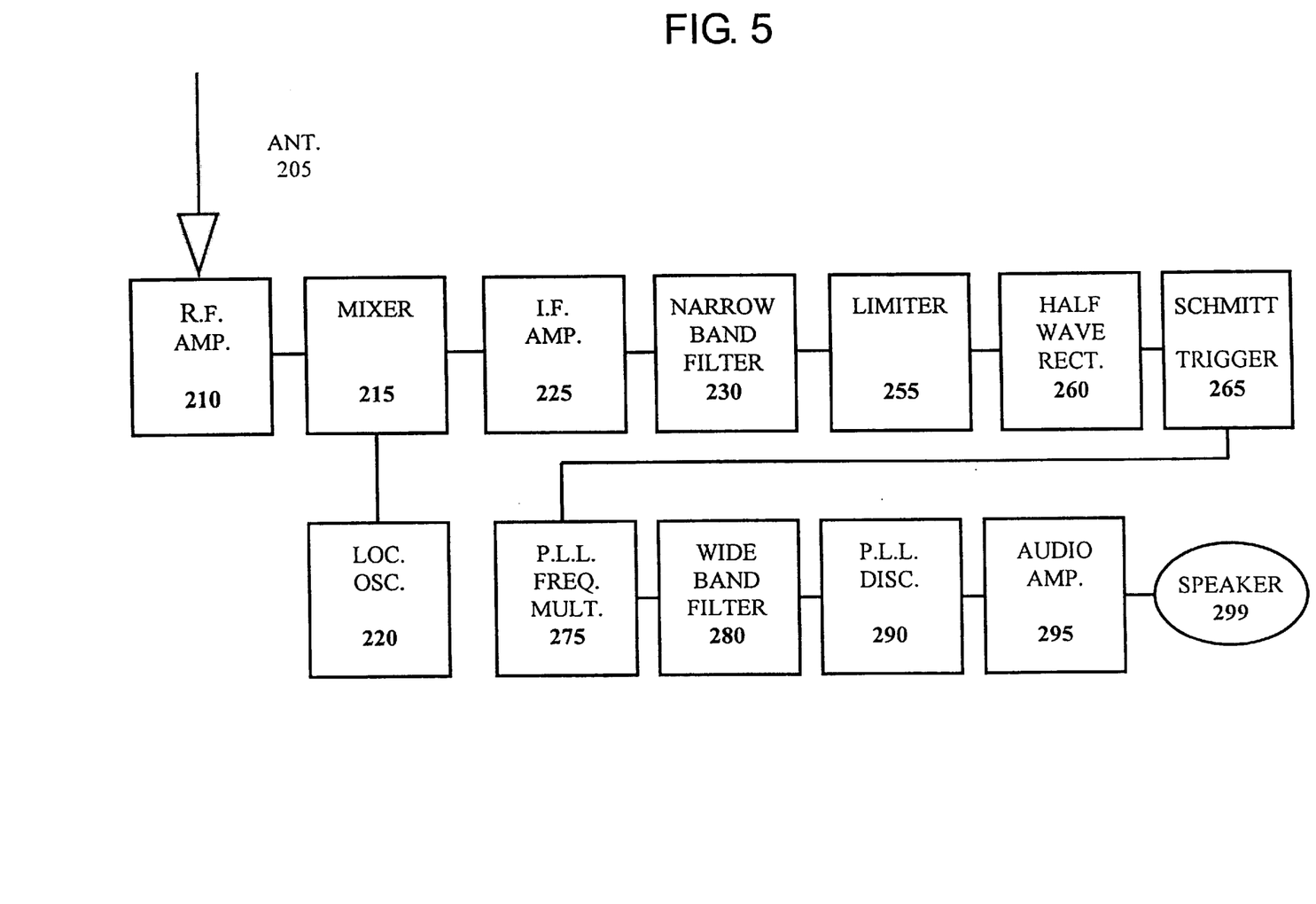
FIG. 5 shows a block diagram of an alternative embodiment of a narrow/very narrow band receiver constructed in accordance with the present invention.

FIG. 5 shows a block diagram of an alternative embodiment of the receiver to receive the narrow/very narrow band FM/PM modulation signal as transmitted from the transmitter according to FIGS. 1–3. Many elements of this embodiment correspond to those of the receiver of FIG. 4, and will not be described repetitively. In addition to the elements of FIG. 4, the FIG. 5 embodiment includes a narrow band filter 230 inserted between IF amplifier 225 and limiter 255, and a wide band filter 280 inserted between frequency multiplier 275 and PLL discriminator 290.

Figure 6:
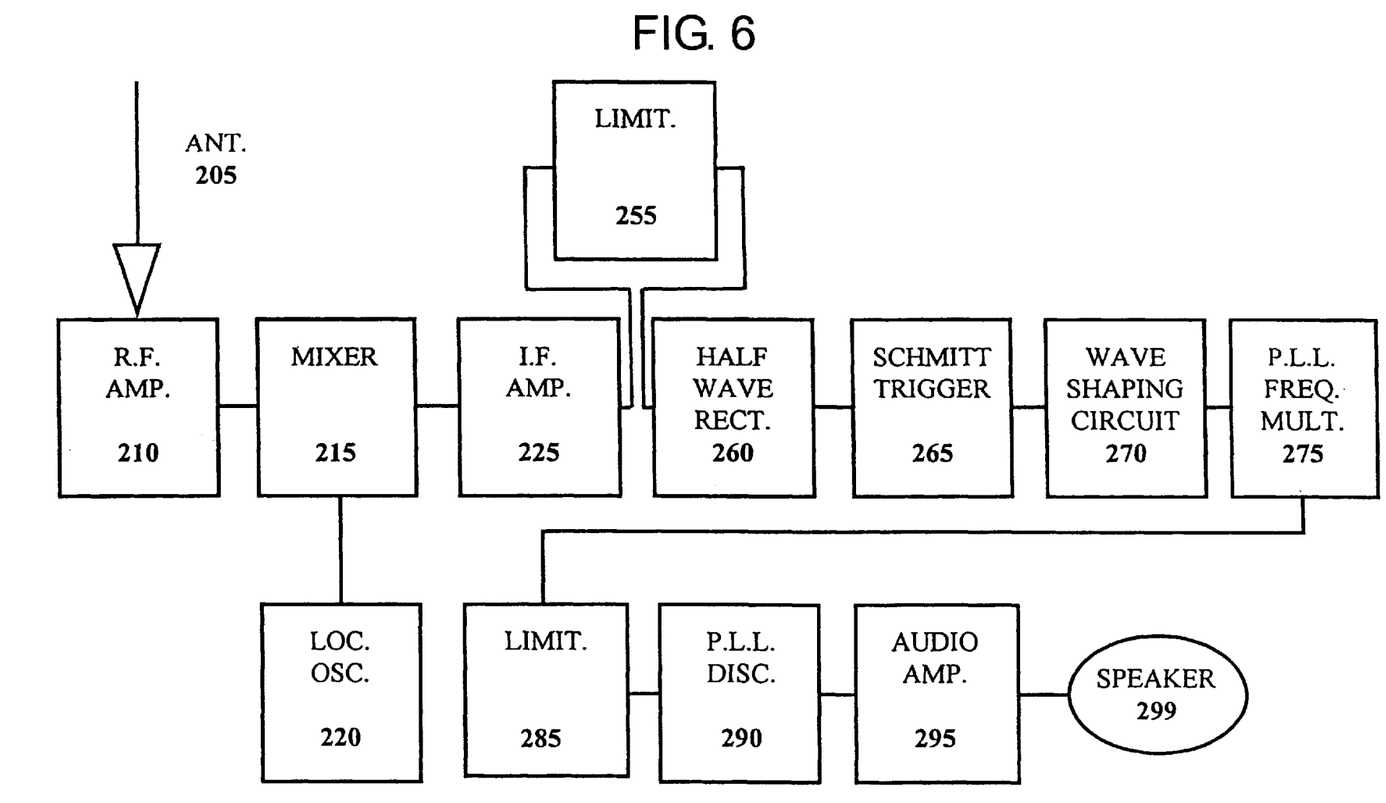
FIG. 6 shows a block diagram of a further alternative embodiment of a narrow/very narrow band receiver constructed in accordance with the present invention.

FIG. 6 shows a block diagram of an alternative embodiment of the receiver to receive the narrow/very narrow band FM/PM modulation signal as transmitted from the transmitter according to FIGS. 1–3. Many elements of this embodiment correspond to those of the receiver of FIG. 4, and will not be described repetitively.

However, in addition to the elements FIG. 4, to remove distortion from schmitt trigger 265, a wave shaping circuit 270 is inserted after the schmitt trigger 265 of FIG. 6 to cut the noise and hysteresis over the positive IF pulses. Some conventional schmitt trigger integrated circuits have this output. This function can also be performed by (for example) a zener diode to smooth the top of the IF pulses, by an inverter to invert the IF pulses, or by a monostable multivibrator triggered by the positive going pulse to get a very clean positive pulse and the time of the output controlled by the resistor and the capacitor in the input of the circuit.

Also in the embodiment of FIG. 6 is another limiter 285 added after the frequency multiplier 275 to eliminate amplitude variation in the frequency-multiplied signal. The limiter's output is connected to the PLL discriminator 290.

Figure 7:
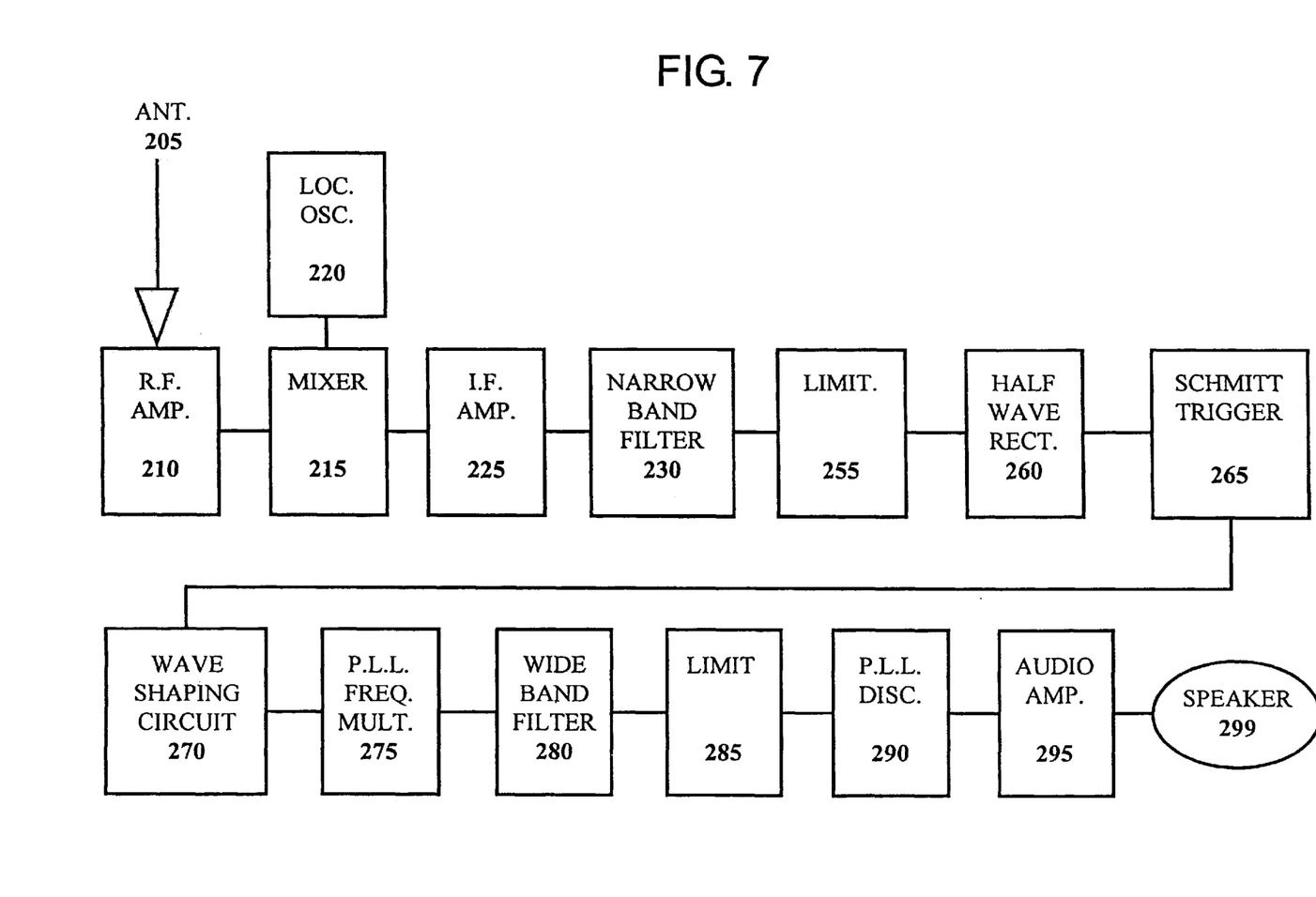
FIG. 7 shows a block diagram of a further alternative embodiment of a narrow/very narrow band receiver constructed in accordance with the present invention.

FIG. 7 shows a block diagram of an alternative embodiment of the receiver to receive the narrow/very narrow band FM/PM modulation signal as transmitted from the transmitter according to FIGS. 1–3. Many elements of this embodiment correspond to those of the receiver of FIG. 6, and will not be described repetitively. In addition to the elements of FIG. 6, the FIG. 7 embodiment includes a narrow band filter 230 inserted between IF amplifier 225 and limiter 255, and a wide band filter 280 inserted between frequency multiplier 275 and limiter 285.

Figure 8:
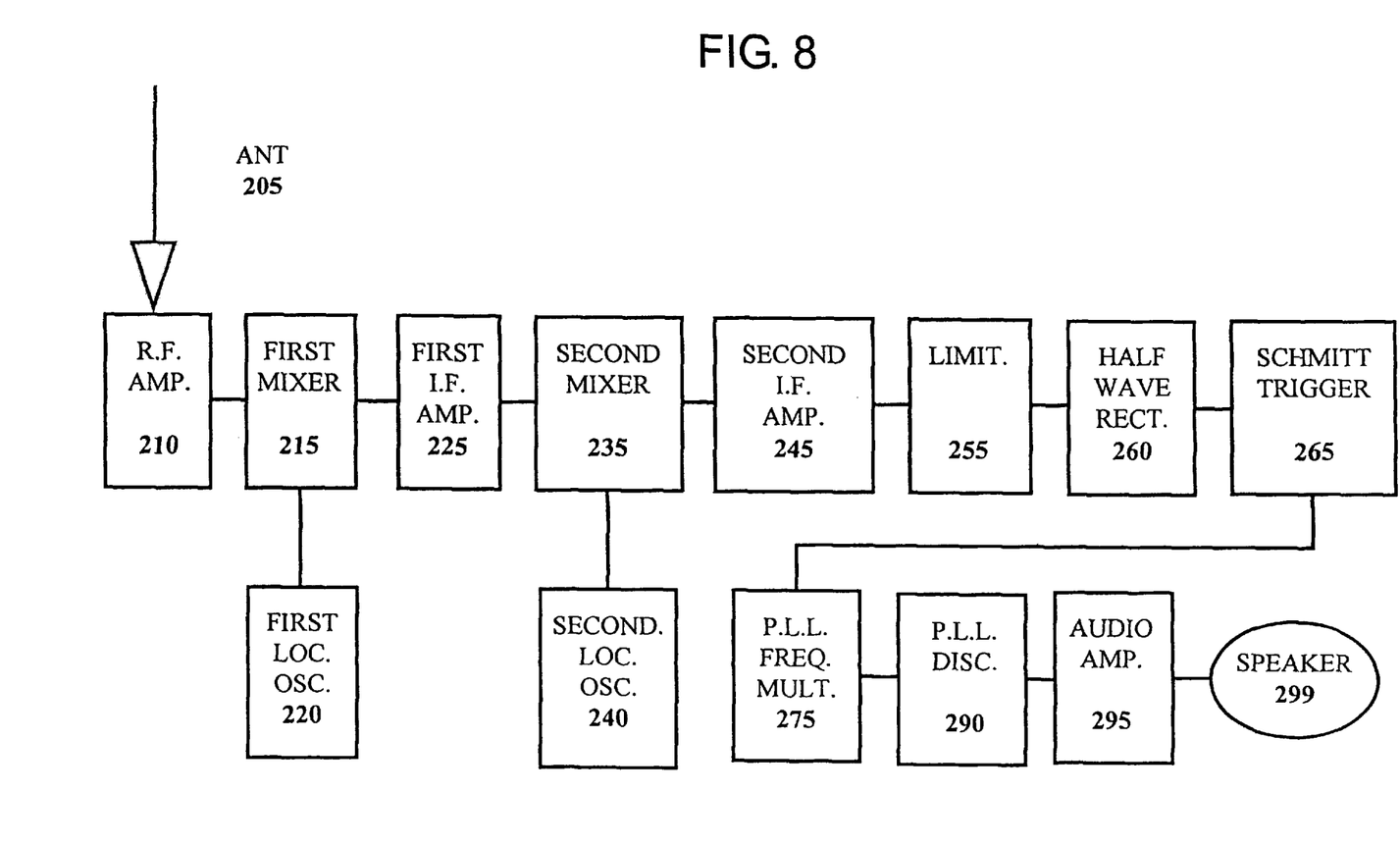
FIG. 8 shows a block diagram of a further alternative embodiment of a narrow/very narrow band receiver in accordance with the present invention.

FIG. 8 shows a block diagram of an alternative embodiment of the receiver to receive the narrow/very narrow band FM/PM modulation signal as transmitted from the transmitter according to FIGS. 1–3. Many elements of this embodiment corresponds the receiver according to the FIG. 4, and will not be repetitively described.

In the FIG. 8 embodiment, to reduce the IF frequency to 455 KHZ or less, a second mixer 235, a second local oscillator 240 and a second IF amplifier 245 are added between the first IF amplifier 225 and the limiter 255. This insertion prevents a very high IF frequency signal which might exceed the frequency limitations of the PLL.

Figure 9:
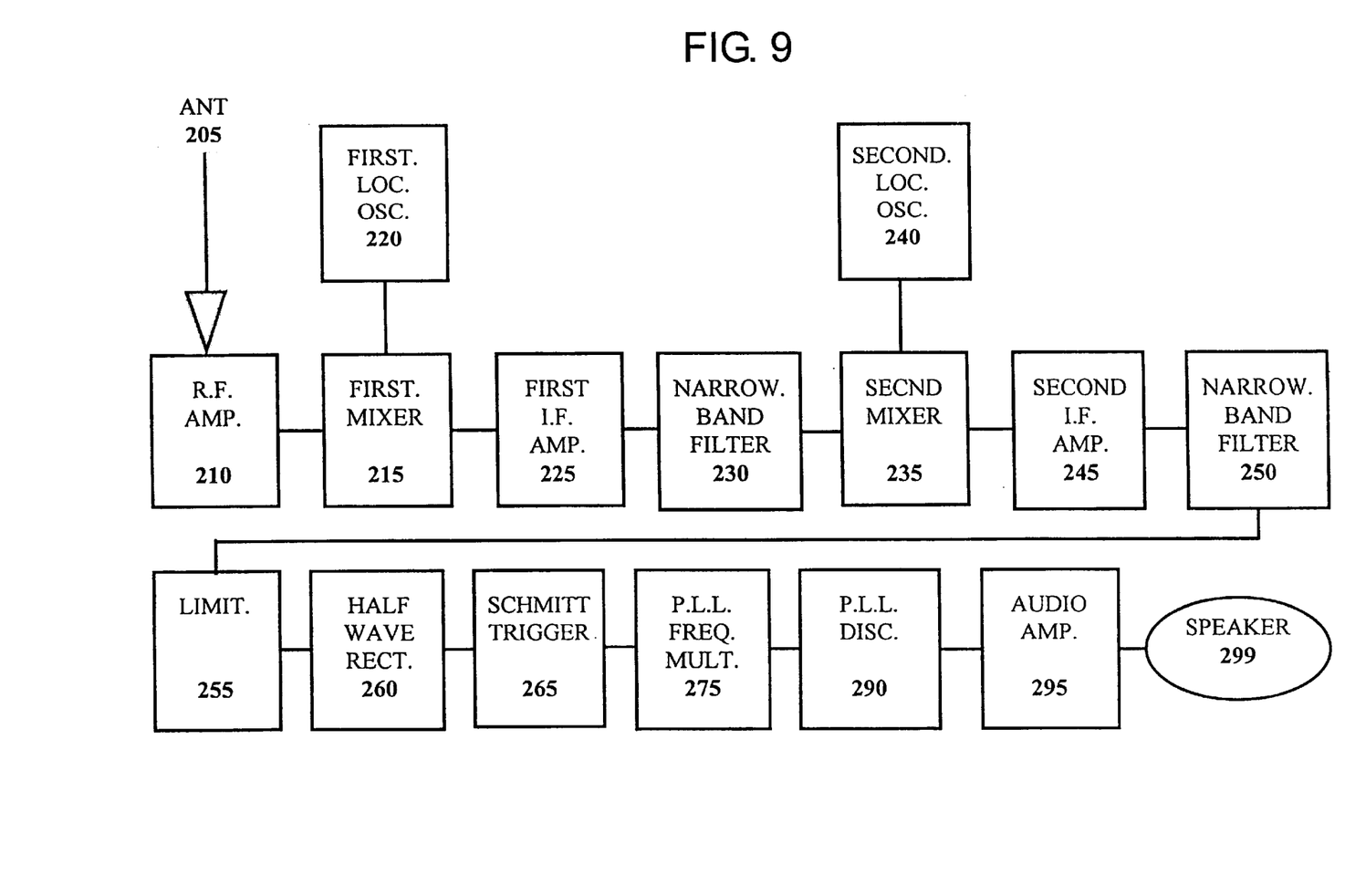
FIG. 9 shows a block diagram of a further alternative embodiment of a narrow/very narrow band receiver constructed in accordance with the present invention.

FIG. 9 shows a block diagram of an alternative embodiment of the receiver to receive the narrow/very narrow band FM/PM modulation signal as transmitted from the transmitter according to FIGS. 1–3. Many elements of this embodiment correspond to those of the receiver of FIG. 8, and will not be described repetitively. In addition to the elements of FIG. 8, the FIG. 9 embodiment includes a narrow band filter 230 inserted between IF amplifier 225 and mixer 235, and a second narrow band filter between IF amplifier 245 and limiter 255.

Figure 10:
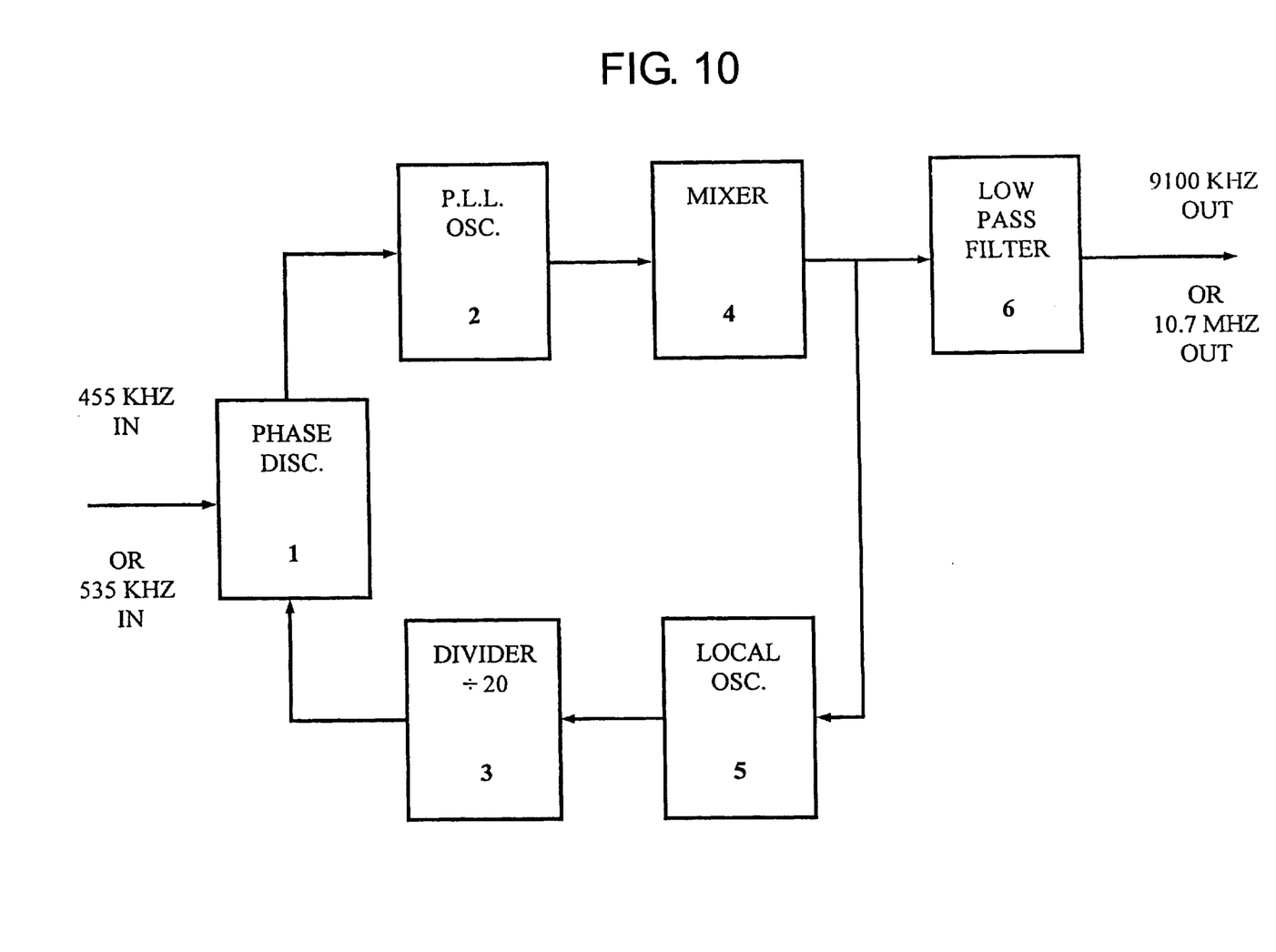
FIG. 10 shows a block diagram of an embodiment of a phase lock loop with frequency multiplication and down conversion which is constructed in accordance with the present invention.

FIG. 10 shows an exemplary phase lock loop which may be used to implement the frequency multiplication function performed by element 275 in FIGS. 4–9.

According to the circuit of FIG. 10, an oscillator 2 of the phase lock loop oscillates with the N-th harmonic of the input frequency, N being a positive integer. A phase discriminator 1 compares the input signal (which may be at 455 kHz) with the oscillator signal after it is divided by factor N (for example, 20) in a divider 3 which is inserted in a closed loop of the phase lock loop amplifier. At the output of the phase lock loop oscillator 2, there is a mixer 4 with local oscillator 5. This mixer is followed by a low pass filter 6. Assuming the 455 kHz input signal mentioned above, the low pass filter provides a signal at 9100 kHz (9.1 MHz), a factor N=20 times the input signal's frequency.

The invention is not limited to the particular frequencies mentioned above. According to the one option. the input signal to phase discriminator 1 is a standard 455 kHz and the output signal from low pass filter 6 is a non-standard 9.1 MHz. However, the invention also provides that, for example, the input signal can be a non-standard 535 kHz so that the output signal is a standard 10.7 MHz.

Figure 11:
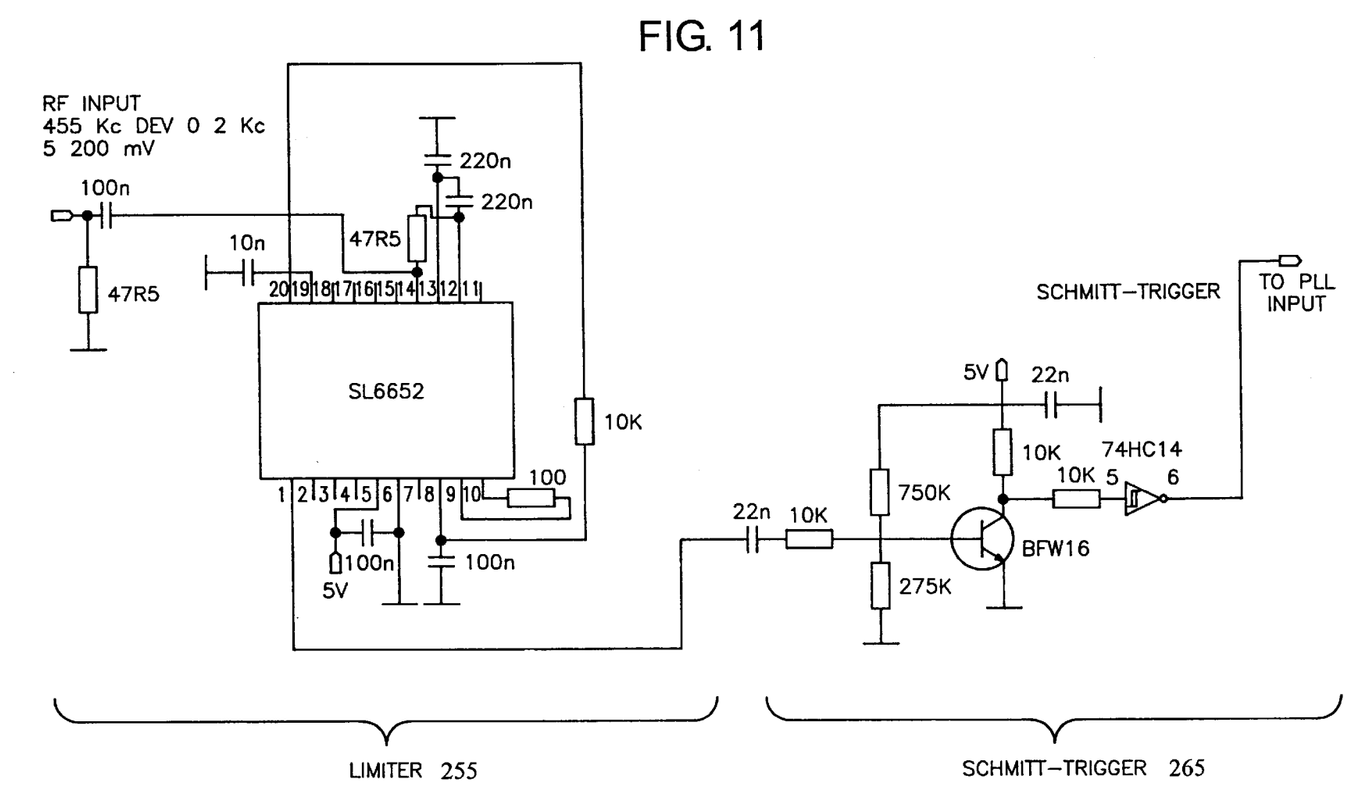
FIG. 11 shows details of an embodiment of a limiter and schmitt trigger device which may be used in embodiments of the receiver according to the present invention.

FIG. 11 illustrates details of an embodiment of a limiter and schmitt trigger according to an embodiment of the invention. The illustrated elements may be considered detailed implementations of certain elements shown in FIGS. 4–9.

For the limiter 255, an SL6652 limiter amplifier is used. The input signal with (for example) a center frequency of 455 kHz in the exemplary embodiment and between 5 and 200 millivolts at 50 ohms is input to pin 14 through a 100 nanofarad capacitor. The differential amplifier is operated in unbalanced mode, with two capacitors and a resistor connected as shown to pins 12–14. The SL6552's internal frequency changer and oscillator are not used in this embodiment.

The schmitt trigger portion 265 receives a square signal with an amplitude of about 500 millivolts, as output by pin 1 of the SL6552. An amplifier circuit having a BFW16 transistor adjusts the signal to CMOS levels, serving as modulation input for the schmitt trigger portion. The schmitt trigger portion provides the signal which is input to the phase lock loop whose detailed implementation is shown in FIG. 12.

Figure 12A:
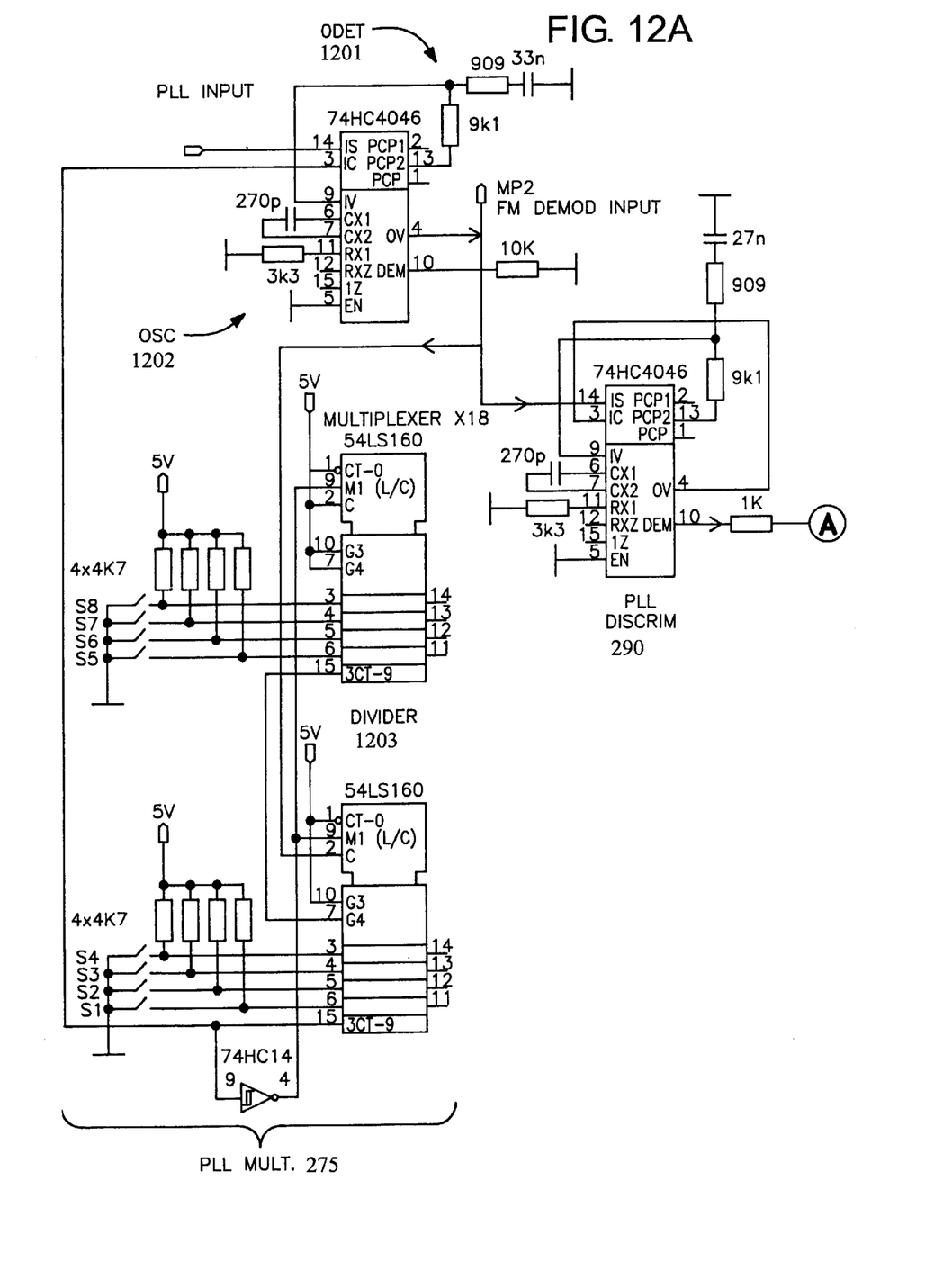
FIG. 12 shows details of an embodiment of a phase lock loop which may be used in an embodiments of the receiver according to the present invention.
Figure 12B:
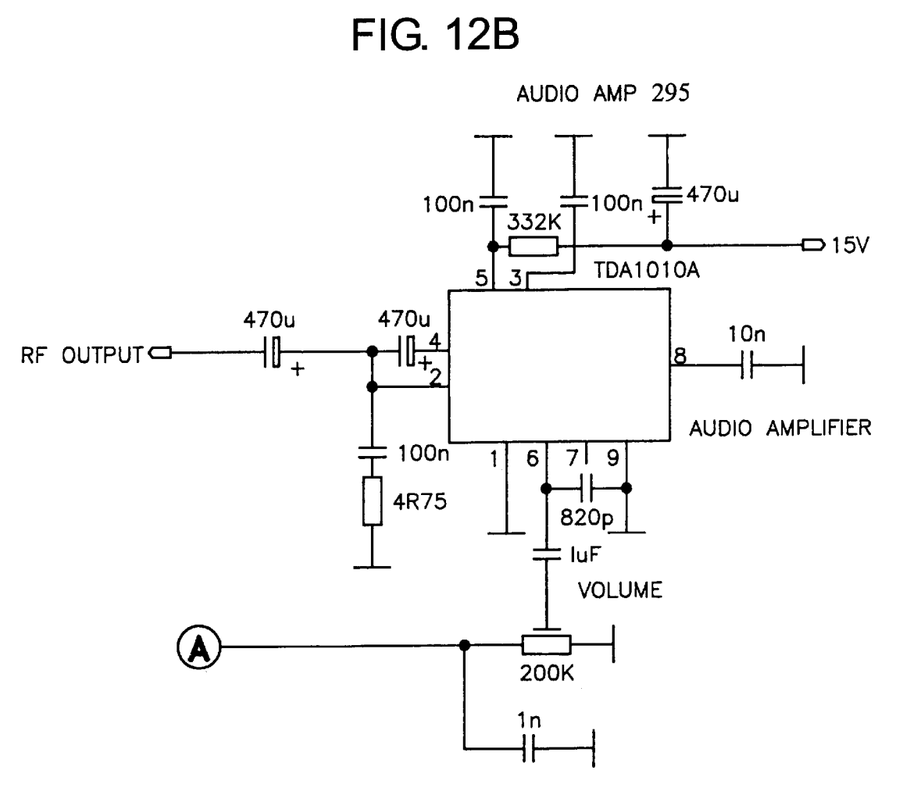

Referring now to FIG. 12, a 74HC4046 oscillator 1202 is shown with associated resistor and capacitor on pins 6, 7, 11 whose values are chosen to allow a maximum frequency of about 10 MHz. A phase comparator (phase detector) 1201 is also illustrated. Comparator number two on the chip is used in this application, and is triggered by a positive slope. The phases of signals on pins 14 and 3 are effectively compared. The 9.9 K ohm resistor and 33 nanofarad capacitor supply the comparison output signal from pin 13 to pin 9 as the control voltage to the oscillator. The 909 ohm resistor provides stability to the loop.

The oscillator output is at pin 4, and is input to 54LS160 binary coded decimal counters serving as loop divider element 1203. The detailed operation of the programmable counters need not be described here as it is well within the ability of those skilled in the art. In any event, the counters provide a signal to the phase comparator's pin 3 which represents a frequency smaller than the oscillator's output frequency by a factor which is determined by the value (for example, 20) which is programmable into the counter.

The demodulation is performed by the 74HC4046 which receives the output signal from pin 4 of the oscillator 1202. This 74HC4046 performs the demodulation function as a conventional FM-PLL discriminator in a manner appreciated by those skilled in the art, and need not be described here. In any event, the demodulator provides an output on pin 11, with the 1 nanofarad capacitor to ground preventing modulation of the following audio frequency amplifier TDA1018A by unwanted high frequency components in the control voltage.

Of course, the particular circuits shown are only illustrative of ways in which the invention may be implemented, and the scope of the invention should be limited not by these implementations but by the language of the claims and their equivalents.

The illustrated embodiments of the invention have the following feature(s):

Modulator-Transmitter.

Preferred embodiments of FM/PM transmitter according to the present invention incorporate the following features:
(1) The amplitude of the modulating signal is designed so that the primary frequency deviation is reduced, so that the total frequency deviation of the transmitted frequency does not exceed a preselected narrow or very narrow bandwidth, for example, 2.5 kHz.
(2) Crystals with higher frequencies than conventional crystals are used to eliminate the secondary frequency deviation (frequency multiplier) stage.
(3) The bandpass filters in the transmitter are designed to avoid interference and to reduce noise.
(4) Means are provided for removing distortion in the transmitter caused by an FM modulated signal in the transmitter, particularly when the modulation index is very low and the modulating signals are sine waves. Such means are preferably implemented using a quasi-steady-state method if the maximum rate of change of the instantaneous frequency is small, or the curves giving magnitude and phase of the admittance Y in the circuit of the transmitter as a function of frequency are both substantially linear over the range of instantaneous frequencies involved.

Receiver-Demodulator.

In order to receive the narrow band FM/PM signal from the transmitter, preferred embodiments of FM/PM receivers according to the present invention preferably incorporate the following characteristics:
(1) The bandpass filters in the receiver are designed so that the narrow band signal can be received without excessive interference.
(2) The local oscillator is designed with an IF frequency value of a standard 455 kHz to avoid high frequency IF after the multiplier stage, or with a second mixer in order to obtain a lower IF frequency of 455 kHz or lower.
(3) Wave-shaping circuits convert sine wave IF signals into clean positive pulses.
(4) A frequency multiplier stage is incorporated before the discriminator, being especially desirable when implemented in the short wave (SW) or medium wave (MW) bands.
(5) The FM receiver includes a radio frequency discriminator amplifier for receiving the narrow band FM/PM signal, followed by a limiter to eliminate amplitude variations in the signal, and a wave-shaping circuit. Then, a means for multiplying the frequency of the IF signal, for example by a multiplication factor of 20, is used. In this way, a secondary frequency deviation is generated locally in the receiver, and the frequency deviation which was minimized in the FM transmitter is compensated (e.g., 2.5 kHz×20=50 kHz). As a result, a new wide band signal is realized in the receiver despite its narrow bandwidth in the transmitted signal.
(6) The new wide band signal may be passed through a limiter to eliminate amplitude variations in the signal. The signal is then passed to a discriminator which converts the FM signal output from the limiter to an audio signal. Through the discriminator, the signal's frequency output is set at the rate of the frequency deviation, and its amplitude is made proportional to the magnitude of the frequency deviation. Finally, the signal is passed to an output stage which includes an audio amplifier and conventional signal processing circuits.

Thus, in summary, according to the present invention, narrow band FM/PM communication is implemented by transmitting a signal with a small/very small frequency deviation (for example, 2.5 kHz). Preferably after the signal is converted down to an IF signal, the signal with the small frequency deviation is expanded in the receiver by frequency multiplying the IF converted signal. As a consequence, the bandwidth limitation (that is, the frequency deviation of the transmitter and of the communication channel) is expanded in the receiver. The result is a high quality sound output comparable to the quality of sound recorded on CD-ROM.

In implementing a narrow band FM/PM system in accordance with the present invention, it is very important to set up a standard to determine the channel spacing to control the total frequency deviation in the transmitter and to determine the minimum frequency multiplication factor to the intermediate frequency in the receiver because the maximum frequency multiplication factor depends on the bandwidth of the PLL circuit (a hardware characteristic).

In contrast to the present invention, in conventional frequency modulation (FM) or phase modulation (PM) with small frequency deviation (that is, with a modulation index M of 1.0 or less), the output signal is comparatively small when using conventional frequency discrimination for demodulation. As a result, signal distortions are comparatively high. However, in many cases, it is advantageous to use a frequency modulation with small modulation index M, as the frequency modulation can be increased in using FM or PM with a small/very small frequency deviation.

In accordance with the present invention, the transmission of FM or PM modulated signals can be realized with a narrow/very narrow band channel with improved sound quality. With the invention, the number of channels of transmission with given frequency range can be increased, and the sound quality can be simultaneously improved.

Modifications and variations of the above-described embodiments of the present invention are possible, as appreciated by those skilled in the art in light of the above teachings. For example, the narrow/very narrow band FM according to the invention can be implemented in the medium wave band (MW-band) or the high frequency band (HF-band), can be broadcast in stereo and in digital audio format, and can be used for high definition television (digital video), fiber optic, and the like. It is therefore to be understood that, within the scope of the appended claims and their equivalents, the invention may be practiced otherwise than as specifically described.

What is claimed is:

1. A method for communicating information via a communication channel connecting a transmitting side and a receiving side, involving frequency or phase modulation with a modulation index M that is not greater than 1.0 to thus compress a bandwidth of an information signal to have a small or very small frequency deviation at the transmitting side of the communication channel and in the communication channel, the method comprising:

frequency or phase modulating an information signal with a modulation index M that is not greater than 1.0 to compress a bandwidth of the information signal to form a narrow band or very narrow band frequency-modulated or phase-modulated information signal having a small or very small frequency deviation at the transmitting side of a narrow or very narrow band communication channel and in said communication channel;

transmitting, via the communication channel, said narrow band or very narrow band frequency-modulated or phase-modulated information signal formed by modulating the information signal with the modulation index M that is not greater than 1.0 so as to have the small or very small frequency deviation;

receiving the narrow band or very narrow band frequency-modulated or phase-modulated information signal from the communication channel at the receiving side of the communication channel; and expanding the frequency deviation of the received narrow band or very narrow band frequency-modulated or phase-modulated information signal at the receiving side without expanding a bandwidth of said communication channel so as to form an expanded-frequency deviation information signal, the step of expanding for improving a signal-to-noise ratio and performed such that a bandwidth of said narrow band or very narrow band communication channel is never expanded.

2. The method of claim 1, further comprising:

converting the expanded-frequency deviation information signal to a low frequency signal or audio signal.

3. The method of claim 1, further comprising:

further processing the expanded-frequency-deviation frequency or phase modulated information signal.

4. The method of claim 1, further comprising:

converting the narrow band or very narrow band frequency-modulated or phase-modulated information signal received from the communication channel to an intermediate frequency (IF) information signal before expanding its frequency deviation.

5. The method of claim 4, further comprising:

passing the IF information signal through a half wave rectifier and schmitt trigger; and cleaning an information signal output by the schmitt trigger with a wave shaping circuit.

6. The method of claim 1, wherein the expanding step includes:

expanding the frequency deviation of the received narrow band or very narrow band frequency-modulated or phase-modulated information signal by frequency multiplication.

7. The method of claim 1, wherein the expanding step includes:

expanding the frequency deviation of the received narrow band or very narrow band frequency-modulated or phase-modulated information signal by a phase lock loop (PLL) frequency multiplier.

8. The method of claim 1, further comprising:

removing noise from the narrow band or very narrow band frequency-modulated or phase-modulated information signal received from the communication channel before it is converted to a low frequency signal or audio signal.

9. The method as set forth in claim 1, further comprising after the step of expanding the step of demodulating the expanded-frequency deviation information signal to output an audio signal having sound quality comparable to sound recorded on CD-ROM.

10. A receiver for receiving and processing narrow band or very narrow band frequency-modulated or phase modulated information signals that have a predetermined small or very small frequency deviation due to compression of transmitted signals, and that have been transmitted over a narrow band or very narrow band communication channel, the receiver comprising:

means for receiving from the communication channel the narrow band or very narrow band frequency-modulated or phase-modulated information signals that have the predetermined small or very small frequency deviation; and a circuit that expands the predetermined small or very small predetermined frequency deviation of the received narrow band or very narrow band frequency or phase modulated information signals, said circuit including a discriminator for demodulating the expanded frequency deviation information signal.

11. The receiver according to claim 10, wherein the frequency deviation expanding circuit includes:

a phase lock loop circuit including a frequency divider having a dividing ratio that corresponds to a selected expansion of the frequency deviation.

12. The receiver of claim 11, wherein:

an output signal of the phase lock loop circuit is down-converted to an intermediate frequency information signal.

13. The receiver of claim 10, wherein the frequency deviation expanding circuit includes:

a circuit having frequency-multiplying characteristics; and a filter, connected to an output of the circuit having frequency-multiplying characteristics, the filter passing a multiplied-frequency signal component.

14. The receiver of claim 10, further comprising:

means for removing noise from information signals from the receiving means before it is converted to a low frequency signal or audio signal.

* * * * *